(12) United States Patent
Afzali-Ardakani et al.

(10) Patent No.: US 7,888,753 B2
(45) Date of Patent: Feb. 15, 2011

(54) ULTRA-SENSITIVE DETECTION TECHNIQUES

(75) Inventors: Ali Afzali-Ardakani, Ossining, NY (US); Sudhir Gowda, Briarcliff, NY (US); Supratik Guha, Chappaqua, NY (US); Hendrik F. Hamann, Yorktown Heights, NY (US); Emanuel Tutuc, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1234 days.

(21) Appl. No.: 11/496,383

(22) Filed: Jul. 31, 2006

(65) Prior Publication Data

US 2010/0330687 A1   Dec. 30, 2010

(51) Int. Cl.
*H01L 29/84* (2006.01)
*H01L 21/00* (2006.01)
(52) U.S. Cl. .................. 257/415; 438/48; 977/724
(58) Field of Classification Search .......... 257/415; 977/724; 438/48
See application file for complete search history.

(56) References Cited

U.S. PATENT DOCUMENTS

| 6,183,097 | B1 * | 2/2001 | Saif et al. | 359/871 |
| 7,652,342 | B2 * | 1/2010 | Bertin | 257/415 |
| 2007/0230241 | A1 * | 10/2007 | Bockrath | 365/164 |

OTHER PUBLICATIONS

K.L. Ekinci et al., Ultimate limits to inertial mass sensing based upon nanoelectromechanical systems, J. Appl. Phys. 95, 2682-2689 (2004).
K.L. Ekinci et al., Ultrasensitive nanoelectromechanical mass detection, Appl. Phys. Lett. 84, 4469-4471 (2004).

* cited by examiner

*Primary Examiner*—W. David Coleman
(74) *Attorney, Agent, or Firm*—Vazken Alexanian; Michael J. Chang, LLC

(57) ABSTRACT

Techniques for ultra-sensitive detection are provided. In one aspect, a detection device is provided. The detection device comprises a source; a drain; a nanowire comprising a semiconductor material having a first end clamped to the source and a second end clamped to the drain and suspended freely therebetween; and a gate in close proximity to the nanowire.

19 Claims, 16 Drawing Sheets

200

|  | CASE #1<br>l=100nm<br>d=15nm | CASE #2<br>l=200nm<br>d=30nm |
|---|---|---|
| EFFECTIVE MASS OF WIRE $M_{eff}$ [g] | $3.8\ 10^{-17}$ | $3.0\ 10^{-16}$ |
| RESONANCE FREQUENCY $f_{res}$ [GHz] | 84 | 42 |
| SPRING CONSTANT: k[N/m] | 276 | 551 |
| QUALITY FACTOR: Q | ~100.000 | ~50.000 |
| SHIFT FOR 1 a.m.u.: $\Delta\omega_{a.m.u.}$ [Hz] | 1,820 | 114 |
| THERMAL NOISE: [Hz/Hz$^{0.5}$] | 0.53 | 0.19 |

|  | CASE #1<br>l=100nm<br>d=15nm | CASE #2<br>l=200nm<br>d=30nm |
|---|---|---|
| FORCE REQUIRED FOR 1 nm [pN] | 2.7 | 5.5 |
| GATE CAPACITANCE [aF] | 2.8 | 11.0 |
| VOLTAGE FOR 1 nm ACTUATION [V] | 0.29 | 0.41 |
| RESISTANCE [kΩ] | 10 | 5 |
| THERMAL RESISTANCE [K/μW] | 44 | 11 |
| MAX. POWER [μW] FOR < 50 K | 1.12 | 4.5 |
| SOURCE-DRAIN VOLTAGE $V_{ds}$ [V] | 0.11 | 0.15 |
| CURRENT DUE TO RESONANCE $I_{res}$ [nA] | 5.3 | 7.5 |
| CURRENT DUE TO DRIVE I [μA] | 0.144 | 0.204 | ial
ULTRA-SENSITIVE DETECTION TECHNIQUES

STATEMENT OF GOVERNMENT RIGHTS

This invention was made with Government support under N66001-05-C-8043 awarded by Defense Advanced Research Projects Agency (DARPA). The Government has certain rights in this invention.

FIELD OF THE INVENTION

The present invention relates to detection techniques, and more particularly, to devices having enhanced detection sensitivity and methods for use thereof.

BACKGROUND OF THE INVENTION

Mass detection devices, such as mass detection resonators, are widely used in many industries. For example, mass detection resonators are used to detect the thickness of thin films in deposition systems.

Mass detection resonators exploit a change in a vibratory mass of a resonator, which can be detected sensitively via a change in the resonance frequency. Specifically, the change in vibratory mass dM of the resonator is related to the shift in the resonance frequency dω as follows, $$d\omega = \frac{-\omega_o dM}{2M_{eff}}, \quad (1)$$

wherein $\omega_o$ represents resonance frequency and $M_{eff}$ represents an effective mass of the resonator. Equation 1 demonstrates that the sensitivity of mass detection (i.e., a larger dω) can be increased by lowering the effective mass $M_{eff}$ of the resonator and/or by increasing the resonance frequency $\omega_o$ of the resonator. Typically, a smaller resonator has a higher resonant frequency.

Progress towards higher mass detection sensitivity has been accomplished, e.g., down to $10^{-18}$ grams (g), using micro-machined resonators produced by focused ion beam milling (FIB). However, further improvements have proven difficult because smaller and lighter resonators translate into higher electrical impedances (of the resonator), while larger bandwidths and more sensitivity are required to detect the motion.

Thus, techniques for effectively improving mass detection sensitivity would be desirable.

SUMMARY OF THE INVENTION

The present invention provides ultra-sensitive detection techniques. In one aspect of the invention, a detection device is provided. The detection device comprises a source; a drain; a nanowire comprising a semiconductor material having a first end clamped to the source and a second end clamped to the drain and suspended freely therebetween; and a gate in close proximity to the nanowire.

In another aspect of the invention, an integrated circuit is provided. The integrated circuit comprises at least one detection device comprising a source; a drain; a nanowire comprising a semiconductor material having a first end clamped to the source and a second end clamped to the drain and suspended freely therebetween; a gate in close proximity to the nanowire; and at least one frequency modulation demodulator in circuit with the at least one detection device, wherein the at least one frequency modulation demodulator is configured to detect a source-drain current modulation in the at least one detection device.

In yet another aspect of the invention, a mass detection device is provided. The mass detection device comprises a source; a drain; a nanowire comprising a semiconductor material having a first end clamped to the source and a second end clamped to the drain and suspended freely therebetween; and a gate separated from the nanowire by a distance of up to about ten nanometers, wherein the gate has a width that is less than a length of the nanowire suspended between the source and the drain, and wherein the nanowire is configured to actuate in response to a voltage being applied to the gate at a given frequency.

In still another aspect of the invention, a molecular detection device is provided. The molecular detection device comprises a source; a drain; a nanowire comprising a semiconductor material having a first end clamped to the source and a second end clamped to the drain, wherein at least a portion of a surface of the nanowire is charge-sensitized; and a gate, at least a portion of which is separated from the source and the drain by a dielectric substrate.

In a further aspect of the invention, a method of operating a mass detection device is provided. The mass detection device comprises a source; a drain; a nanowire comprising a semiconductor material having a first end clamped to the source and a second end clamped to the drain and suspended freely therebetween; and a gate separated from the nanowire by a distance of up to about ten nanometers, wherein the gate has a width that is less than a length of the nanowire suspended between the source and the drain. The method comprises the following steps. The nanowire is actuated. Mechanical resonance of the nanowire is detected.

In still a further aspect of the invention, a method of operating a molecular detection device is provided. The molecular detection device comprises a source; a drain; a nanowire comprising a semiconductor material having a first end clamped to the source and a second end clamped to the drain, wherein at least a portion of a surface of the nanowire is charge-sensitized; and a gate, at least a portion of which is separated from the source and the drain by a dielectric substrate. The method comprises the following steps. Free electrical charge is generated in the nanowire, rendering the nanowire conductive. The molecular detection device is exposed to an ambient containing at least one compound. Reactions between the charge-sensitized surface of the nanowire and the compound are detected.

A more complete understanding of the present invention, as well as further features and advantages of the present invention, will be obtained by reference to the following detailed description and drawings.

DETAILED DESCRIPTION OF PREFERRED EMBODIMENTS

Figure 1:
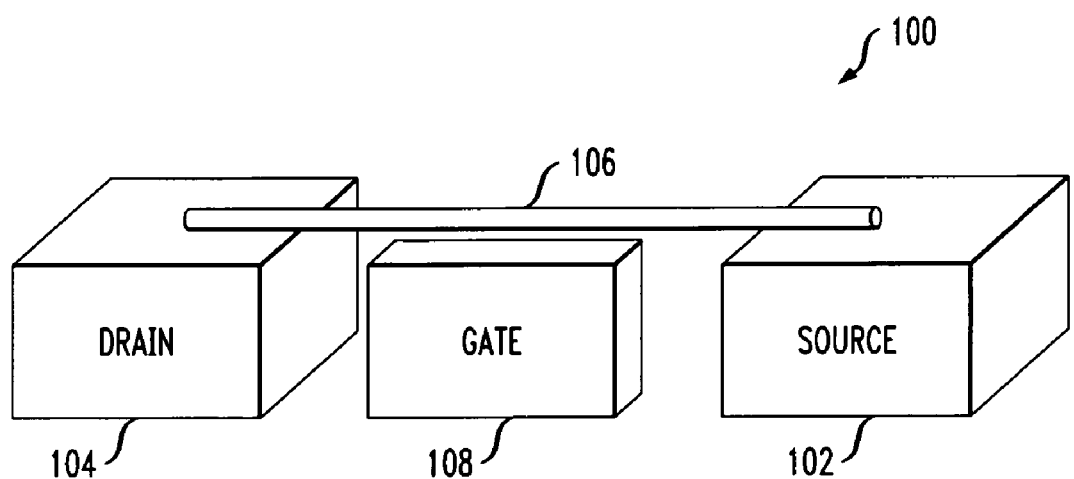
FIG. 1 is a diagram illustrating an exemplary mass detection device according to an embodiment of the present invention.

FIG. 1 is a diagram illustrating exemplary mass detection device 100. Mass detection device 100 comprises three contacts, namely source 102, drain 104 and gate 108. Nanowire 106, suspended freely between source 102 and drain 104 (i.e., so nanowire 106 is free to actuate as described below), has one end thereof attached, i.e., clamped, to source 102 and another end thereof clamped to drain 104. While FIG. 1 depicts nanowire 106 as being clamped to an upper surface of source 102/drain 104, this configuration is merely exemplary. Other configurations may be similarly employed. See, for example, FIG. 14 (described below) wherein a nanowire is clamped between facing sides of a source and a drain.

As will be described in detail below, nanowire 106 functions in mass detection device 100 as a nanomechanical resonator. A nanomechanical resonator has several distinct resonance frequencies, which will also be described below.

Source 102 can comprise any suitable metallic or semiconducting material including, but not limited to, one or more of silicon (Si), germanium (Ge), palladium (Pd), gold (Au) and platinum (Pt). Similarly, drain 104 can comprise any suitable metallic or semiconducting material including, but not limited to, one or more of Si, Ge, Pd, Au and Pt.

Source 102 and drain 104 may have a same, or a different, composition as each other. According to one exemplary embodiment, source 102 and drain 104 have the same composition, each comprising Au.

Nanowire 106 can comprise any suitable nanostructure semiconducting material including, but not limited to, one or more of Si, Ge, galliumarsenide (GaAs), indiumphosphide (InP), graphene (C) and organic semiconductors, such as Pentacene. According to one exemplary embodiment, nanowire 106 comprises Si.

Gate 108 is located at a very close distance to nanowire 106, e.g., between about five nanometers (nm) and about 30 nm. A width of gate 108 is preferably less than a length of nanowire 106, so as to avoid large stray capacitances between gate 108 and source 102/drain 104. By way of example only, if the length of nanowire 106 is about 100 nm, then the width of gate 108 can be on the order of about 50 nm. As is described below, the length of nanowire 106 refers to a length of nanowire 106 suspended between source 102 and drain 104, i.e., the distance between source 102 and drain 104 to which nanowire 106 is clamped. According to an exemplary embodiment, gate 108 is separated from nanowire 106 by air in the presence of a vacuum which will allow nanowire 106 to actuate, or move, as will be described in detail below.

Gate 108 can comprise any suitable metallic or semiconducting material, including, but not limited to, one or more of Si, Ge, Pd, Au and Pt. According to one exemplary embodiment, gate 108 comprises Au.

Any one of source 102, drain 104, nanowire 106 and gate 108 may be doped, e.g., with one or more of an n-type or p-type doping agent. By way of example only, a suitable n-type doping agent includes, but is not limited to, boron (B) and a suitable p-type doping agent includes, but is not limited to, phosphorous (P).

According to one exemplary embodiment, mass detection device 100 comprises an all integrated transistor-like ultra-sensitive mass detection device, wherein the resonator consists of suspended nanowire 106 forming a channel of the transistor. As will be described in detail below, the resonator is actuated via the capacitive force of nanowire 106, and mechanical resonance is detected via current modulation in the channel.

Mass detection device 100, as depicted in FIG. 1, highlights an important feature of the present techniques, namely that the extremely small mass of a silicon nanowire (i.e., less than one femtogram (fg), see FIG. 5, described below) is exploited herein for higher mass detection sensitivity. For example, as will be described below, mass detection device 100 can be utilized for mass detection at atomic mass unit (a.m.u.) resolution.

Figure 2A:
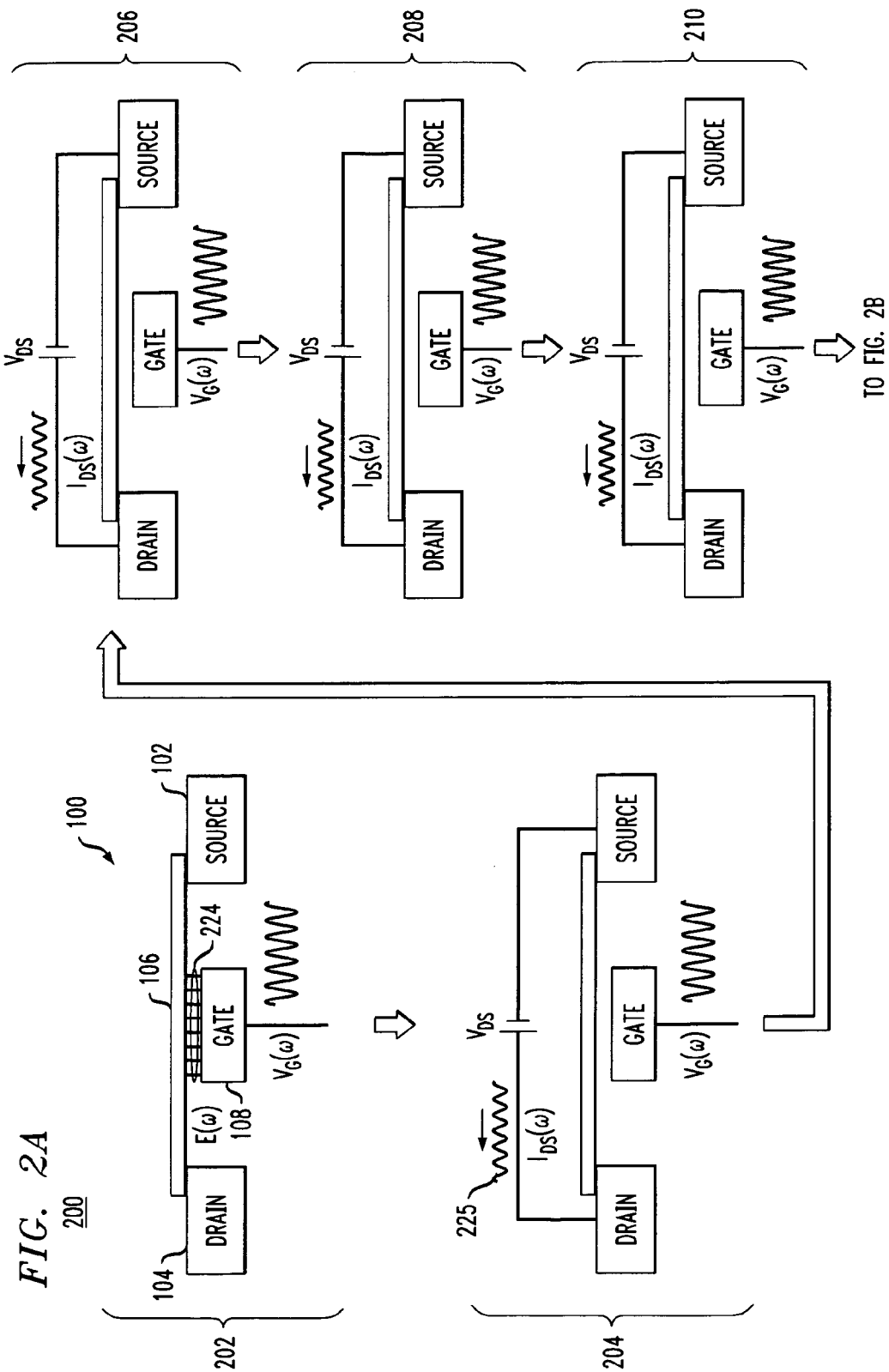
FIGS. 2A-B are diagrams illustrating an exemplary methodology for operation of the mass detection device of FIG. 1 according to an embodiment of the present invention.
Figure 2B:
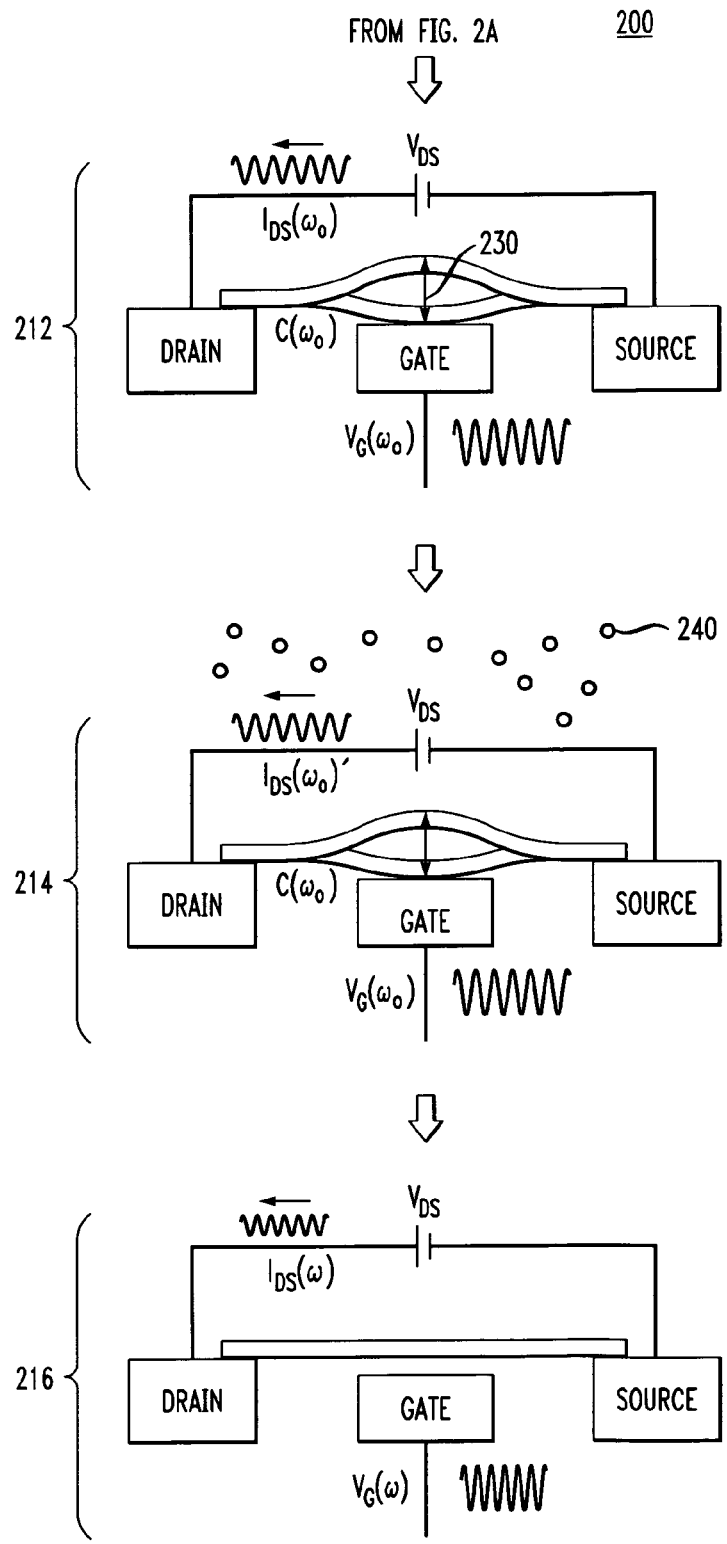

FIGS. 2A-B are diagrams illustrating exemplary methodology 200 for operating mass detection device 100. For ease of depiction, methodology 200 is divided between FIGS. 2A and 2B, e.g., steps 202-210 of methodology 200 are shown depicted in FIG. 2A, and steps 212-216 are shown depicted in FIG. 2B.

As described, for example, in conjunction with the description of FIG. 1, above, mass detection device 100 comprises source 102 and drain 104 with nanowire 106 suspended freely therebetween, and gate 108 at a close distance to nanowire 106.

According to exemplary methodology 200 shown depicted in FIG. 2, nanowire 106 comprises a semiconductor nanowire, e.g., a Si nanowire.

In step 202, a sinusoidal gate voltage $V_G$ is applied to gate 108 at a frequency ω, i.e., $V_G(\omega)$. $V_G(\omega)$ will induce a time-varying electric field E between gate 108 and nanowire 106 (acting as a capacitor) at the frequency ω, i.e., E(ω) (represented by field lines 224).

As highlighted above, nanowire 106 comprises a semiconductor, e.g., Si, nanowire. Thus, in step 204, when a source-drain bias voltage $V_{DS}$ is applied to source 102 and drain 104, a source-drain, i.e., channel, current $I_{DS}$ modulation is induced, due to the transconductance effects of the semiconductor material of nanowire 106, at the frequency w, i.e., $I_{DS}(\omega)$ (represented by waveform 225). The magnitude of this transconductance effect will be discussed in more detail below.

In steps 206-210 the frequency ω of the gate voltage $V_G$ modulation is changed. This results in a change in the frequency ω of the source-drain current $I_{DS}$ modulation. Specifically, when ω of $V_G$ is increased from step 206 to step 208, and then again from step 208 to step 210, ω of $I_{DS}$ modulation is similarly increased.

As described above, $V_G(\omega)$ will induce a modulated electric field E(ω) between gate 108 and nanowire 106. E(ω) has a force F(ω), associated therewith, that is exerted on nanowire 106.

Now with reference to FIG. 2B, in step 212, as a result of F(ω) nanowire 106 can be actuated. Namely, when the frequency w of the gate voltage $V_G$ modulation equals a resonance frequency $\omega_o$ of nanowire 106 (i.e., when $\omega=\omega_o$), F(ω) is sufficient to actuate, or move, nanowire 106 at $\omega_o$. The actuation of nanowire 106, as shown in step 212, can be in an up and down motion, wherein nanowire 106 moves up and down a distance 230. As a result of an up and down motion, the distance between nanowire 106 and gate 108 is modulated.

A modulation in the distance between nanowire 106 and gate 108 results in a modulation of the gate capacitance C at the frequency $\omega_o$, i.e., $C(\omega_o)$, between nanowire 106 and gate 108. In turn, the modulation of $C(\omega_o)$ between nanowire 106 and gate 108 gives rise to an additional source-drain current $I_{DS}(\omega_o)$ modulation. $I_{DS}(\omega_o)$ reflects the resonance frequency of nanowire 106 acting as a nanomechanical resonator.

In step 214, the mass of nanowire 106 changes, e.g., is increased. By way of example only, the mass of nanowire 106 can be increased by the deposition of a material(s), i.e., material 240, on nanowire 106, e.g., during thin film deposition processes.

An increase in the mass of nanowire 106 results in a different resonance frequency of nanowire 106. Detecting the resonance frequency of nanowire 106 will be described in detail below. Therefore, according to an exemplary embodiment, mass detection device 100 can be used to monitor changes in mass by monitoring changes in the resonance frequency, which is detected via the $I_{DS}(\omega_o)$ modulation. Namely, a change in mass is reflected by a change in $I_{DS}(\omega_o)$ modulation, i.e., from $I_{DS}(\omega_o)$ to $I_{DS}(\omega_o)'$.

In step 216, if the frequency ω of the gate voltage $V_G$ modulation is too high (i.e., when $\omega>\omega_o$), then the up/down mechanical motion of nanowire 106 will cease and the resulting additional source-drain current $I_{DS}(\omega_o)$ modulation will disappear. As such, $I_{DS}(\omega)$ is again governed solely by E(ω).

Figure 3:
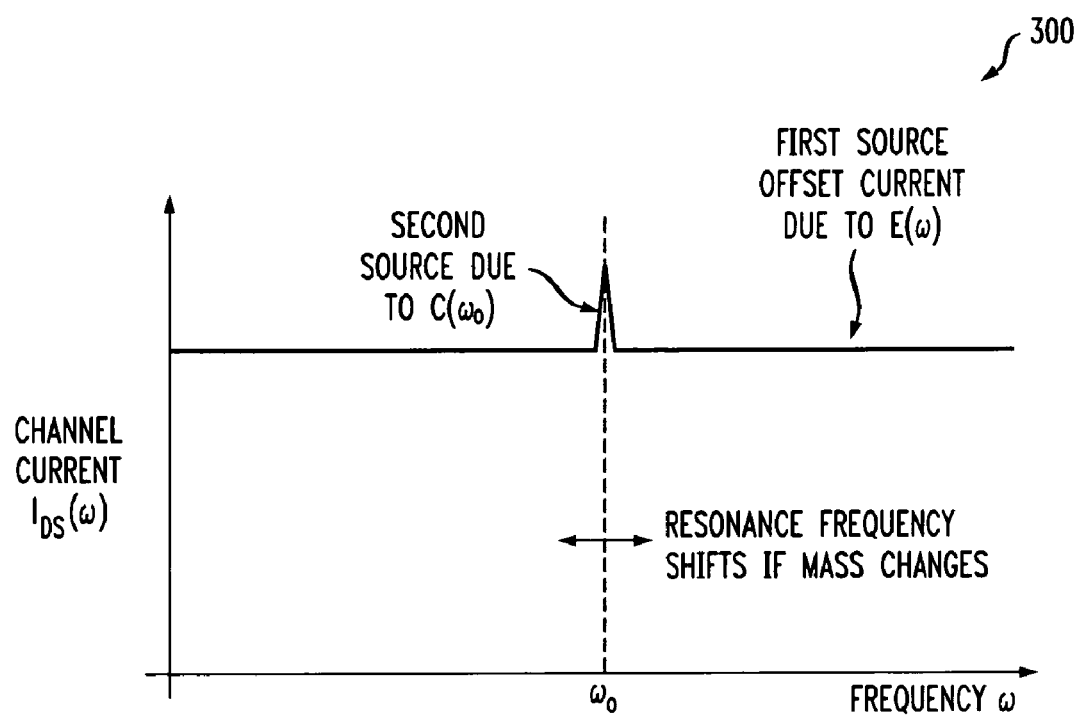
FIG. 3 is an exemplary plot illustrating source-drain current as a function of frequency according to an embodiment of the present invention.

Thus, according to methodology 200, there are essentially two sources for current modulation. The first source is due to electric field E(ω) modulation between gate 108 and nanowire 106 and does not depend on the intrinsic nanomechanical properties of nanowire 106 (and thus the mass of nanowire 106). FIG. 3 is exemplary plot 300 illustrating source-drain, i.e., channel, current $I_{DS}(\omega)$ as a function of frequency ω. The first source of current modulation is shown in FIG. 3 as an offset, which is independent of frequency. The first source can be zeroed out (i.e., $I_{DS}(\omega)=0$) by having $V_{DS}$ at 180 degrees out of phase with $V_G$.

The second source for current modulation reflects the nanomechanical resonance of nanowire 106 (namely, the modulation of the gate capacitance $C(\omega_o)$ due to the actual motion of nanowire 106) and, as described above, occurs only if the frequency ω of the gate voltage matches a resonance of nanowire 106 (i.e., $\omega=\omega_o$). As such, mass detection device 100 acts as a nanomechanical device and the mechanical resonance of nanowire 106 is detected via source-drain current $I_{DS}(\omega_o)$ modulation.

Figure 4:
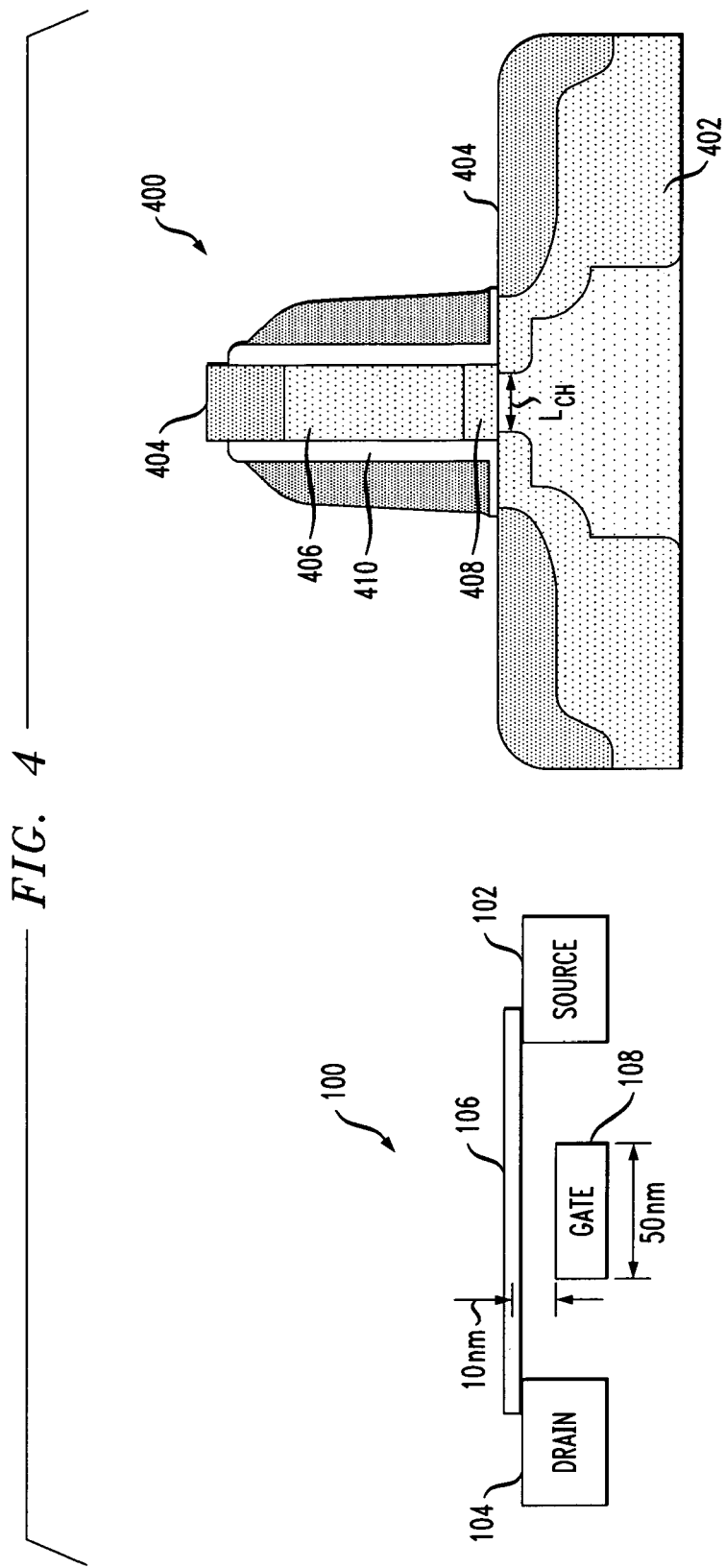
FIG. 4 is a diagram illustrating design compatibilities between the mass detection device of FIG. 1 and a short channel complementary metal oxide semiconductor field-effect transistor (MOS-FET) according to an embodiment of the present invention.

FIG. 4 is a diagram illustrating design compatibilities between mass detection device 100 and short channel complementary metal oxide semiconductor field-effect transistor (MOS-FET) 400. Namely, according to an exemplary embodiment, mass detection device 100 is CMOS FET compatible. As described above, mass detection device 100 comprises source 102 and drain 104 with nanowire 106 suspended therebetween, and gate 108 at a close distance to nanowire 106. As shown in FIG. 4, the distance between nanowire 106 and gate 108 can be up to about ten nm and the width of gate 108 can be up to about 50 nm. As further shown in FIG. 4, CMOS FET device 400 comprises deep source/drain 402, silicide 404, gate 406, gate dielectric 408 and spacer 410.

As such, in order to fabricate mass detection device 100, challenges relating to device, process, materials and circuits would be similar to challenges that have successfully been overcome in CMOS technology. Therefore, in one exemplary embodiment, CMOS technology is employed in the fabrication of mass detection device 100. By way of example only, according to this exemplary embodiment, the resulting mass detection device 100 comprises an on-chip all Si, integrated, CMOS-compatible, ultra-sensitive mass detector. FIG. 4 highlights another important feature of the present techniques, namely that parallels in fabrication between mass detection device 100 and nanoscale CMOS transistors can be leveraged with on-chip CMOS fabricated in circuitry.

Figures 5, 6:
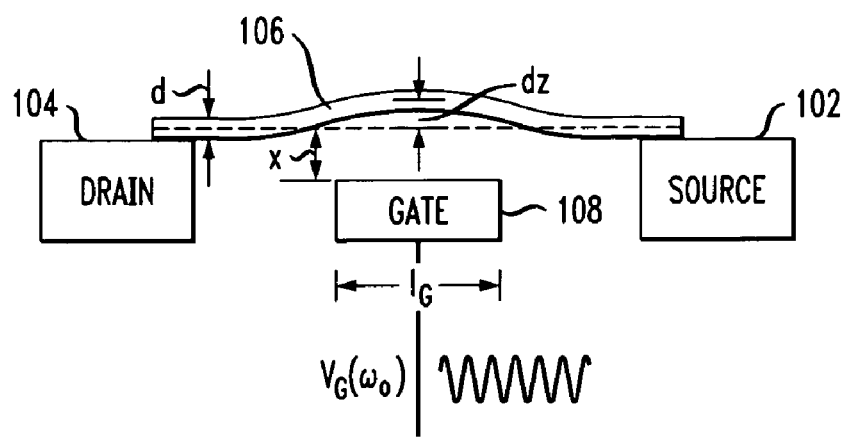
FIG. 5 is an exemplary chart illustrating mechanical properties for two exemplary mass detection device configurations according to an embodiment of the present invention.
FIG. 6 is a diagram illustrating gate voltage estimation according to an embodiment of the present invention.

FIG. 5 is exemplary chart 500 illustrating mechanical properties for two exemplary configurations of mass detection device 100. In the first configuration (labeled "CASE #1"), nanowire 106 has a diameter d of 15 nm and a length l of 100 nm.

The length l of nanowire 106 refers to the distance between source 102 and drain 104, to which nanowire 106 is clamped as described above.

In the second configuration (labeled "CASE #2"), nanowire 106 has a d of 30 nm and a l of 200 nm. Again, the l of nanowire 106 refers to the distance between source 102 and drain 104, to which nanowire 106 is clamped.

With both configurations, i.e., CASE #1 and CASE #2, nanowire 106 is treated as a rectangular beam in the following calculations (which reasonably approximates the typical round shape of a nanowire). For example, in the first configuration, d=15 nm is considered the equivalent of both a width w and a thickness t of nanowire 106 being 15 nm, i.e., w=t=15 nm. Similarly, in the second configuration, d=30 nm is considered the equivalent of both the width w and thickness t of nanowire 106 being 30 nm, i.e., w=t=30 nm.

As shown in chart 500, with temperature $T_e$, quality factor Q, density ρ, Young's modulus E, w, t and l of nanowire 106, i.e., a double-clamped resonator, the effective mass of nanowire 106 $M_{eff}$ (measured in grams (g)) can be determined as follows, $$M_{eff}=0.735*w*l*t*\rho, \tag{2}$$

the effective spring constant k (measured in Newtons/meter (N/m)) of nanowire 106 can be determined as follows, $$k=32.0*E*t^3*w/l/l/l \tag{3}$$

and the first resonant frequency $\omega_o$ of nanowire 106 can be determined as follows, $$\omega_o = 2.0*\pi*1.05*\sqrt{\frac{E}{\rho}}*t/l/l. \tag{4}$$

The quality factor Q can be estimated based on K. L. Ekinci et al., *Ultimate limits to inertial mass sensing based upon nanoelectromechanical systems*, J. APPL. PHYS. 95, 2682-2689 (2004), the disclosure of which is incorporated by reference herein.

It is notable that the resonance frequencies found are in a Gigahertz (GHz) range for the two configurations. The frequency shift, which would occur in the resonance frequency if one a.m.u. (one a.m.u.=1.67×10$^{-24}$ g) was added, is given by, $$\Delta\omega_{a.m.u.}=1.67\times10^{-24}*\omega_o/2.0/M_{eff} \tag{5}$$

yielding 1,820 Hertz (Hz) and 114 Hz for CASE #1 and CASE #2, respectively. In order to estimate whether, and how, these frequency shifts can be detected, the thermal-mechanical noise of the resonator, i.e., nanowire 106, is considered while neglecting other possible noise contributions such as temperature fluctuations, adsorption/desorption and momentum exchange noise of the resonator. The thermal noise (measured in Hz/Hz$^{0.5}$) can be determined as follows, $$\omega_{thermal}=\sqrt{(k*T_e/E_c*\omega_o/Q)}, \tag{6}$$

wherein $E_c$ is the excitation energy. See, for example, K. L. Ekinci et al., *Ultrasensitive nanoelectromechanical mass detection*, APPL. PHYS. LETT. 84, 4469-4471 (2004), the disclosure of which is incorporated by reference herein. Other noise sources include temperature fluctuations, adsorption/desorption noise and momentum exchange noise. Chart 500 illustrates that in both CASE #1 and CASE #2 the nanowires are extremely sensitive to mass changes and can yield substantial frequency shifts above the thermal noise limit.

FIG. 6 is a diagram illustrating gate voltage $V_G$ estimation. Namely, in FIG. 6, magnitudes of gate voltage $V_G(\omega_o)$ that can actuate nanowire 106 are shown. The parameters set forth, for example, in chart 500 described in conjunction with the description of FIG. 5, above, are assumed for the following calculations. For illustrative purposes, it is assumed that a gap distance x between nanowire 106 and gate 108 is 100 Angstroms (Å) and a peak-to-peak actuation, i.e., deflection, dz of ten Å is being sought. The gate capacitance C can be estimated assuming two parallel plates by, $$C=\epsilon_o*w*l_g/x, \tag{7}$$

wherein $\epsilon_o$ is the dielectric constant and $l_g$ is the gate length (here assumed to be 50 nm for both CASE #1 and CASE #2). The capacitive force F between nanowire 106 and gate 108 for dz equal to one nm deflection can be estimated by:

$$F=dz*k/Q, \tag{8}$$

assuming the resonator amplifies the motion by the quality factor Q. The required peak-to-peak voltage ($V_{PP}$) between gate 108 and nanowire 106, i.e., $V_G$, for this one nm deflection is determined as follows, $$V_G(@\omega_o)=\sqrt{(F*2*x^2/\epsilon_o/w/l_g)}. \tag{9}$$

It is notable that the results of these calculations yield voltages between 0.3 Vpp and 0.4 Vpp as a gate voltage $V_G$, which is in a very reasonable range.

Figure 7A:
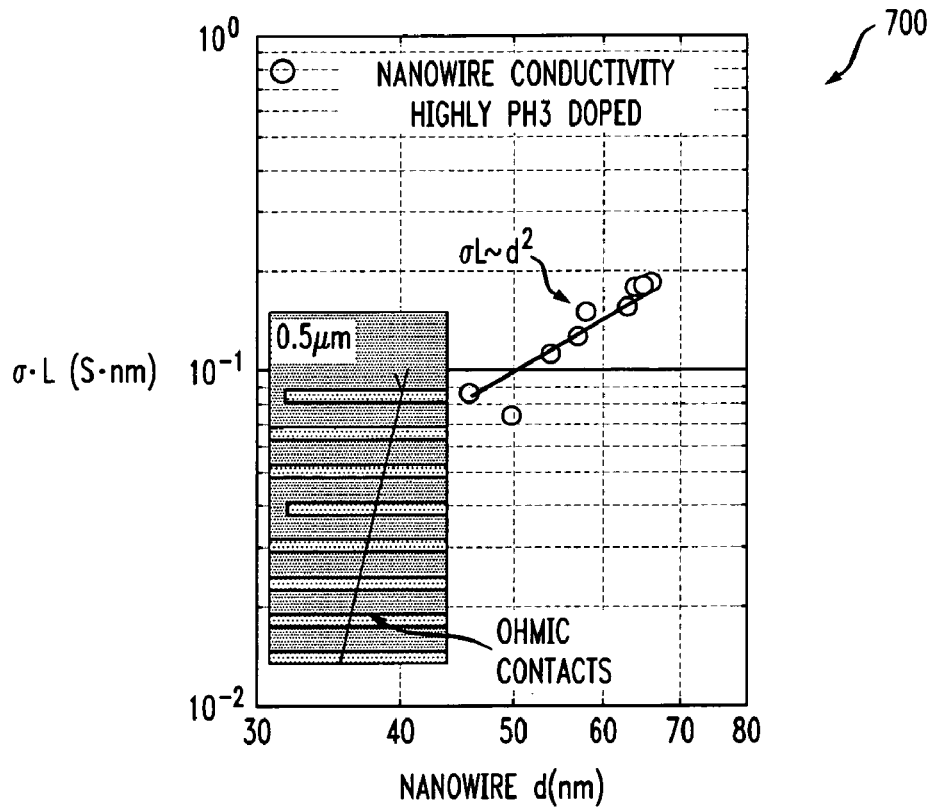
FIGS. 7A-B are diagrams illustrating nanowire impedances and corresponding source-drain voltage in an exemplary mass detection device according to an embodiment of the present invention.
Figure 7B:
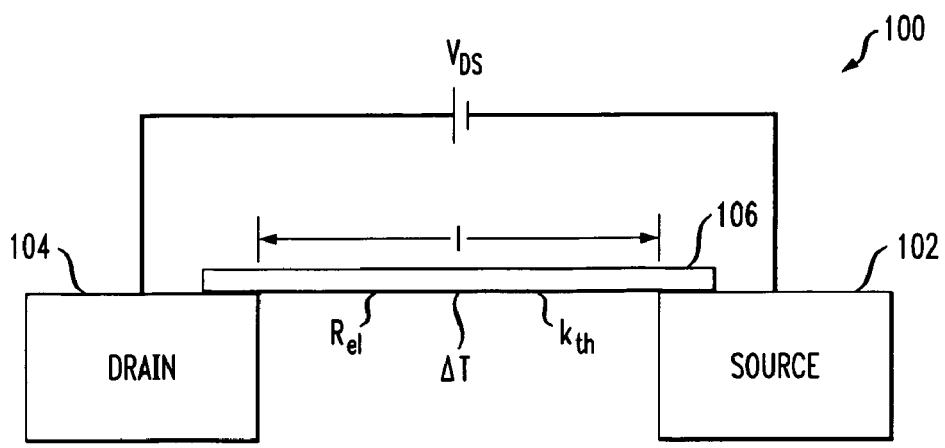

FIGS. 7A-B are diagrams illustrating nanowire impedances and corresponding source-drain voltage in exemplary mass detection device 100. Namely, in FIG. 7A, conductance σ·L (measured in Siemens (S)·nm (S·nm)) of highly-doped Ge nanowires are presented as a function of nanowire diameter (measured in nm), i.e., showing 0.01 nm/ohm (Ω) for a 15 nm diameter nanowire.

The parameters set forth, for example, in chart 500 described in conjunction with the description of FIG. 5, above, are assumed for this description. As shown in the data, conductance increases with the square of the diameter. Based on this data, the electrical resistance $R_{el}$ of nanowire 106 can be estimated as follows, $$R_{el}=l/(0.01\text{ nm}/\Omega*(w/15.0\text{ nm})*(w/15.0\text{ nm})/l) \tag{10}$$

assuming a conductance of 0.01 nm/Ω at a 15 nm diameter nanowire (based on units in Equation 10). Specifically, ten and five kiloohm (kΩ) are found for CASE #1 and CASE #2, respectively.

Such impedances are rather large and make on-chip amplification favorable. As discussed further below, the techniques described herein allow CMOS based on-chip amplification.

The self-heating of nanowire 106 sets a limit for the maximum source-drain bias voltage $V_{DS}$, which can be applied to nanowire 106. Thermal resistance $R_{th}$ is approximated by, $$R_{th}=l/k_{th}/w/t, \tag{11}$$

wherein $k_{th}$ is thermal conductivity of nanowire 106. In Equation 11 it is assumed that nanowire 106 is thermally well connected to source 102 and to drain 104.

To account for additional phonon scattering, a thermal conductivity $k_{th}$ of 10.0 watts/meter·Kelvin (W/mK) and 20.0 W/mK is assumed for a d=w=t=15 nm Si nanowire (CASE #1) and a d=w=t=30 nm Si nanowire (CASE #2), respectively. In order to limit self-heating of the nanowire to less than ΔT≦50 Kelvin (K) above ambient, the maximum allowed power $P_{max}$ and the corresponding source-drain currents $I_{DS}$ and source-drain voltages $V_{DS}$ can be determined as follows, $$P_{max}=50.0K/R_{th}, \tag{12}$$

$$I_{DS}=\sqrt{(P_{max}/R_{el})} \text{ and} \tag{13}$$

$$V_{DS}=R_{el}*I_{DS}. \tag{14}$$

From Equations 12-14 it can be determined that the maximum power $P_{max}$ into nanowire 106 has to be limited to be less than five microwatts (μW), which results in a $V_{DS}$ of 0.1-0.2 volts (V), which again is a reasonable range.

FIG. 7B is a diagram illustrating the estimations for the source-drain bias voltage for exemplary mass detection device 100. Namely, FIG. 7B highlights that each of the factors, e.g, $R_{el}$, $\Delta T$ and $k_{th}$, described in conjunction with the description of FIG. 7A, above, affect nanowire 106 of exemplary mass detection device 100.

Figure 8:
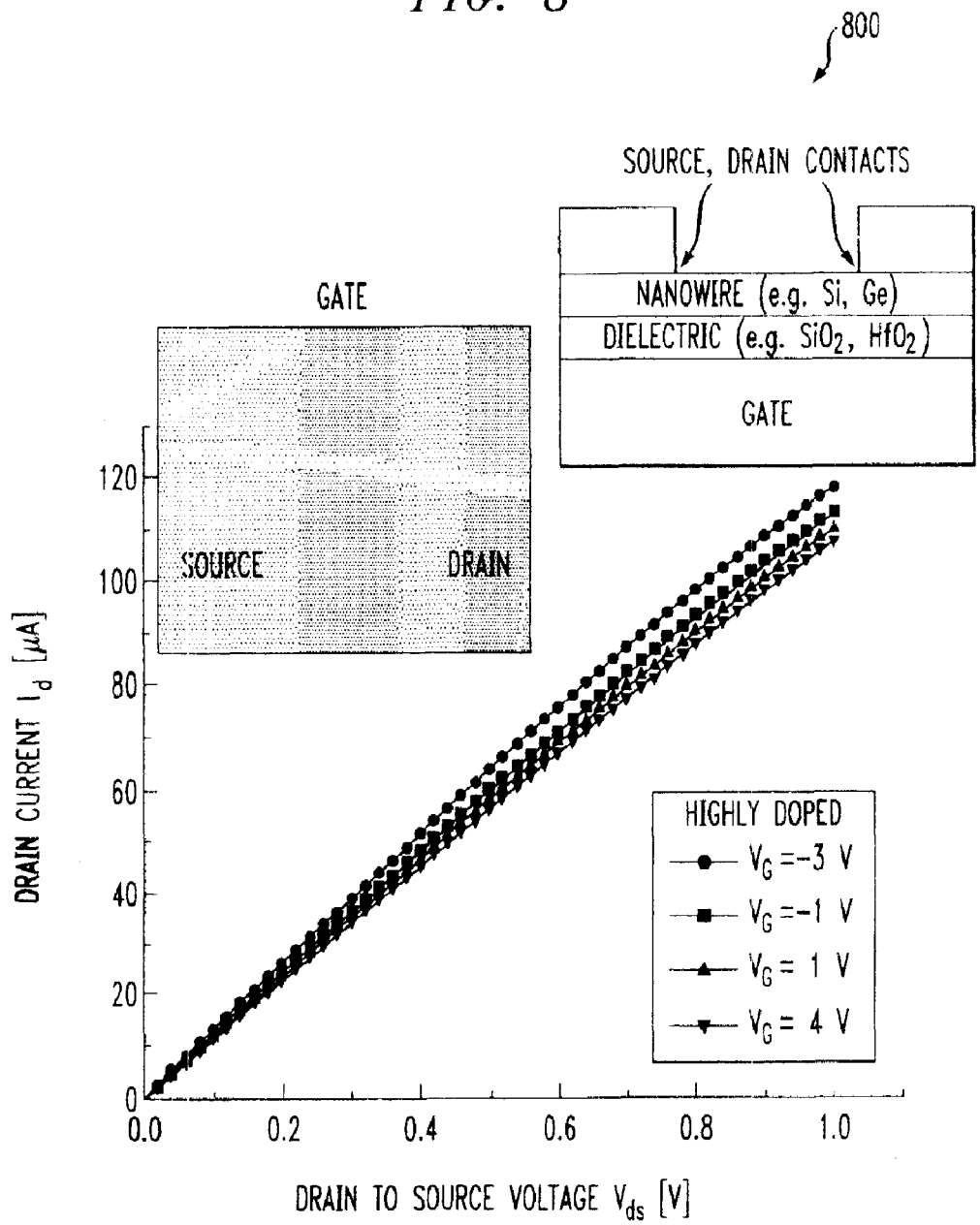
FIG. 8 is an exemplary plot illustrating current signal levels in an exemplary mass detection device according to an embodiment of the present invention.

FIG. 8 is exemplary plot 800 illustrating current signal levels in exemplary mass detection device 100. Namely, in plot 800 drain current $I_d$ (measured in microamps (μA)) is plotted as a function of source-drain voltage $V_{DS}$ (measured in V). $I_d$ is the current flowing through nanowire 106 when $V_{DS}$ is applied. As described above, capacitance is modulated by the actuation of nanowire 106 on resonance. In plot 800, transconductance data of highly $PH_3$-doped Ge nanowires yielding two milliamps per volt (mA/V) is shown. In the following, it is taken into account that the dielectric constant is reduced in mass detection device 100. A change of ten percent in capacitance (i.e., dz equals one nm with x equal to ten nm, see for example, FIG. 6, described above) results in a current modulation of about seven nanoamps (nA) for the ten kΩ nanowire (first configuration) and about five nA for the five kΩ nanowire (second configuration). Although these current levels are small and thus challenging to detect, on-chip integrated transimpedance amplifiers are able to amplify these signals with sufficient signal to noise.

Figures 9, 10:
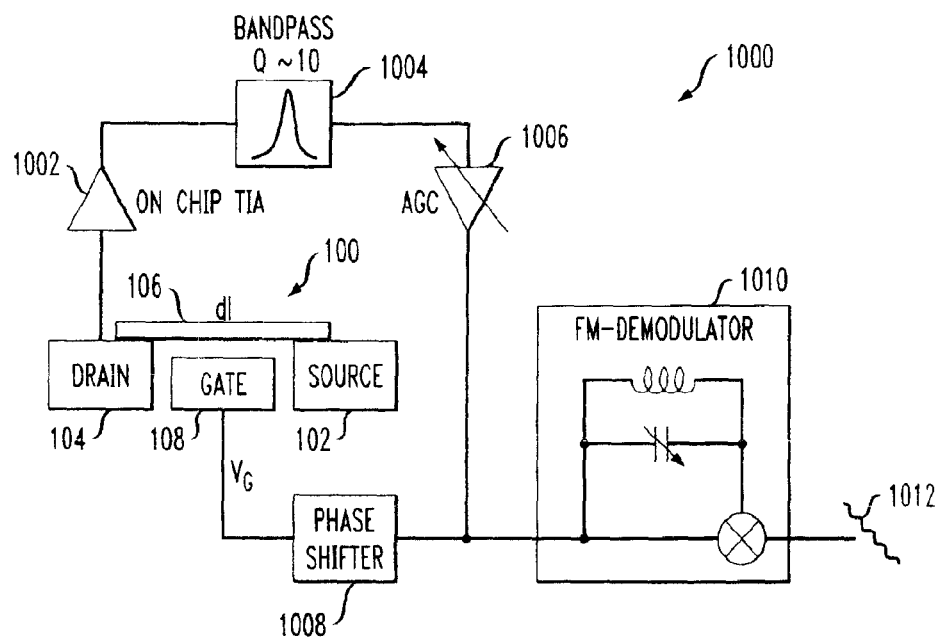
FIG. 9 is an exemplary chart summarizing estimated electrical device properties of two exemplary mass detection device configurations according to an embodiment of the present invention.
FIG. 10 is a diagram illustrating an exemplary circuit according to an embodiment of the present invention.

FIG. 9 is exemplary chart 900 summarizing estimated electrical device properties of two exemplary configurations of mass detection device 100. The parameters set forth, for example, in chart 500 described in conjunction with the description of FIG. 5, above, are also used to derive the data set forth in chart 900. For example, in a first case (labeled "CASE #1") nanowire 106 has a diameter d of 15 nm and a length l of 100 nm, and in a second case (labeled "CASE #2") nanowire 106 has a diameter d of 30 nm and a length l of 200 nm. These two cases are merely exemplary and it is notable that other configurations may be similarly employed.

The final two rows of chart 900, highlighted by circle 902, illustrate the current levels 1) due to the actual mechanical resonance (row labeled "Current due to resonance $I_{res}$ [nA]" and 2) due to the drive, or gate, voltage $V_G$ (row labeled "Current due to drive I[μA]"). As described above, the current due to $V_G$ can be zeroed out with appropriate electronics.

FIG. 10 is a diagram illustrating exemplary circuit 1000. Circuit 1000 includes on-chip transimpedance amplifier (TIA) 1002 (for high bandwidth (BW) amplification), mass detection device 100, bandpass filter 1004, automatic gain control circuit (AGC) 1006 (to compensate for losses in circuit 1000 and resonator, i.e., nanowire 106, and to provide enough gain), phase-shifter 1008 (to provide positive feedback to maintain the oscillation) and frequency modulation (FM)-demodulator 1010. As will be described below, mass detection device 100 in circuit 1000 can be replaced with another type of detection device, e.g., a molecular detection device.

Mass detection device 100, described, for example, in conjunction with the description of FIG. 1, above, acts as a very high Q, e.g., between 1,000 and about 100,000, bandpass filter, which determines the resonance frequency of an auto-oscillation circuit. As the resonance frequency of nanowire 106 changes (for example, as the mass on nanowire 106 is changed) the circuit oscillates at a different frequency. Bandpass filter 1004, e.g., having a low Q (i.e., between about ten and about 100), may also be included in this auto-oscillation circuit to reject higher harmonics of the oscillator.

The resonant frequency is demodulated using FM-demodulator 1010 (comprising a mixer) and phase-shifter 1008. Although phase-shifter 1008 is depicted here as an electrical inductor-capacitor LC tank, the sensitivity of FM-demodulator 1010 depends on the Q of this LC tank. In another exemplary embodiment, the phase-shift may be provided by another nanowire device (instead of by phase-shifter 1008), identical to mass detection device 100 except for having a nanowire with a lower Q.

The direct current (DC) output of FM-demodulator 1010 is a measurement for the resonance frequency of the nanowire. For example, if mass is added, the resonance frequency is lowered. As a result, the phase-sensitive output of FM-demodulator 1010 is shifted, as shown in FIG. 10. Namely, with stepped line 1012, each step thereof represents, e.g., one a.m.u., being added to nanowire 106.

Figure 11:
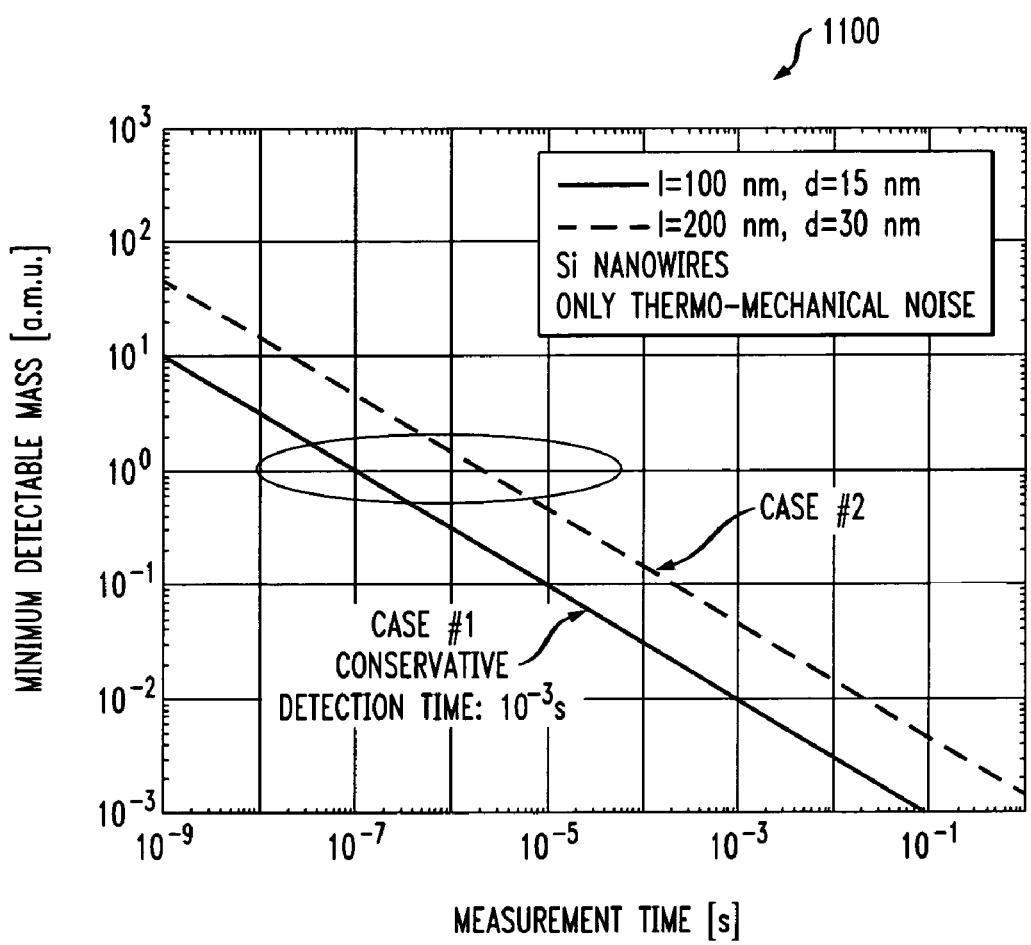
FIG. 11 is an exemplary plot illustrating estimated detection limits as a function of detection time for two exemplary mass detection device configurations according to an embodiment of the present invention.

FIG. 11 is exemplary plot 1100 illustrating estimated detection limits (measured in a.m.u.), e.g., in a vacuum, as a function of detection time (measured in seconds (s)) for the two mass detection device configurations, i.e., CASE #1 and CASE #2 described in conjunction with the description of FIG. 5, above. CASE #1 is depicted by the line labeled "l=100 nm, d=15 nm," and CASE #2 is depicted by the line labeled "l=200 nm, d=30 nm."

Figure 12A:
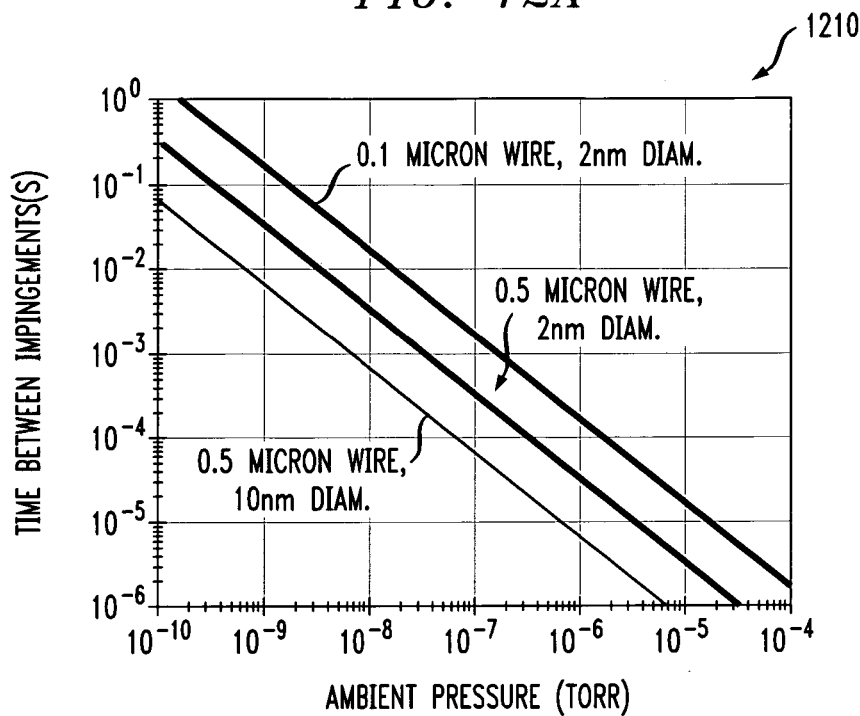
FIG. 12A is an exemplary plot illustrating gas molecule impingement rates onto nanowire samples used in conjunction with an exemplary mass detection device according to an embodiment of the present invention.

FIG. 12A is an exemplary plot 1210 illustrating gas molecule impingement rates onto three nanowire samples representative of nanowire 106 used in conjunction with mass detection device 100, described, for example, in conjunction with the description of FIG. 1, above. Namely, in plot 1210, time between gas molecule impingements (measured in s) is shown as a function of ambient pressure (measured in torr) for each of the following nanowire samples, a 0.1 micrometer (micron) long nanowire with a two nm diameter, a 0.5 micrometer long nanowire with a two nm diameter and a 0.5 micrometer long nanowire with a ten nm diameter.

Figure 12B:
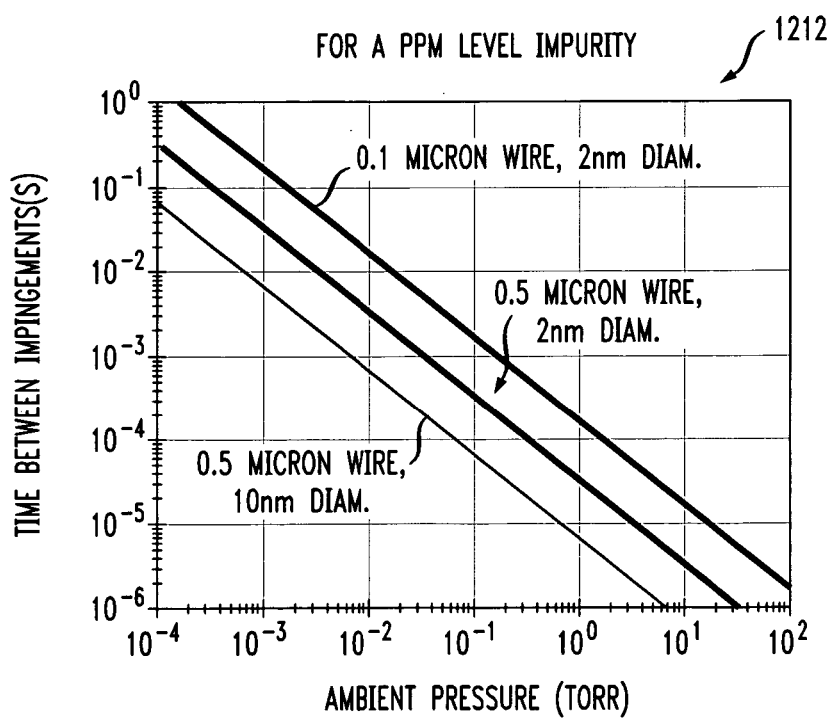
FIG. 12B is an exemplary plot illustrating gas molecule impingement rates onto nanowire samples having a parts per million level impurity according to an embodiment of the present invention.

The results shown in plot 1210 can be compared with those shown in FIG. 12B. FIG. 12B is an exemplary plot 1212 illustrating gas molecule impingement rates onto three nanowire samples having a parts per million (ppm) level impurity. Namely, in plot 1212, time between gas molecule impingements (measured in s) is shown as a function of ambient pressure (measured in torr) for each of the following nanowire samples having a ppm level impurity, i.e., a 0.1 micrometer long nanowire with a two nm diameter, a 0.5 micrometer long nanowire with a two nm diameter and a 0.5 micrometer long nanowire with a ten nm diameter. In plot 1212, as compared to plot 1210, the ambient pressure axis has been divided by $10^6$.

Estimating the gas molecule impingement rates onto nanowire 106 helps to assess whether there is enough bandwidth or measurement time for individual molecules with one a.m.u. at ppm level impurity in vacuum conditions. For example, plot 1210 shows a 100 millisecond (ms) time delay for a molecule (at ppm level) hitting a typical nanowire 106 at $10^{-4}$ Torr. In combination with the estimations provided in plot 1100, described in conjunction with the description of FIG. 11, above, it is apparent that there is a high enough bandwidth and signal-to-noise ratio to observe a single a.m.u. at ppm level impingement times in a vacuum, so long as other noise sources (besides thermal noise) can be neglected.

Figure 13:
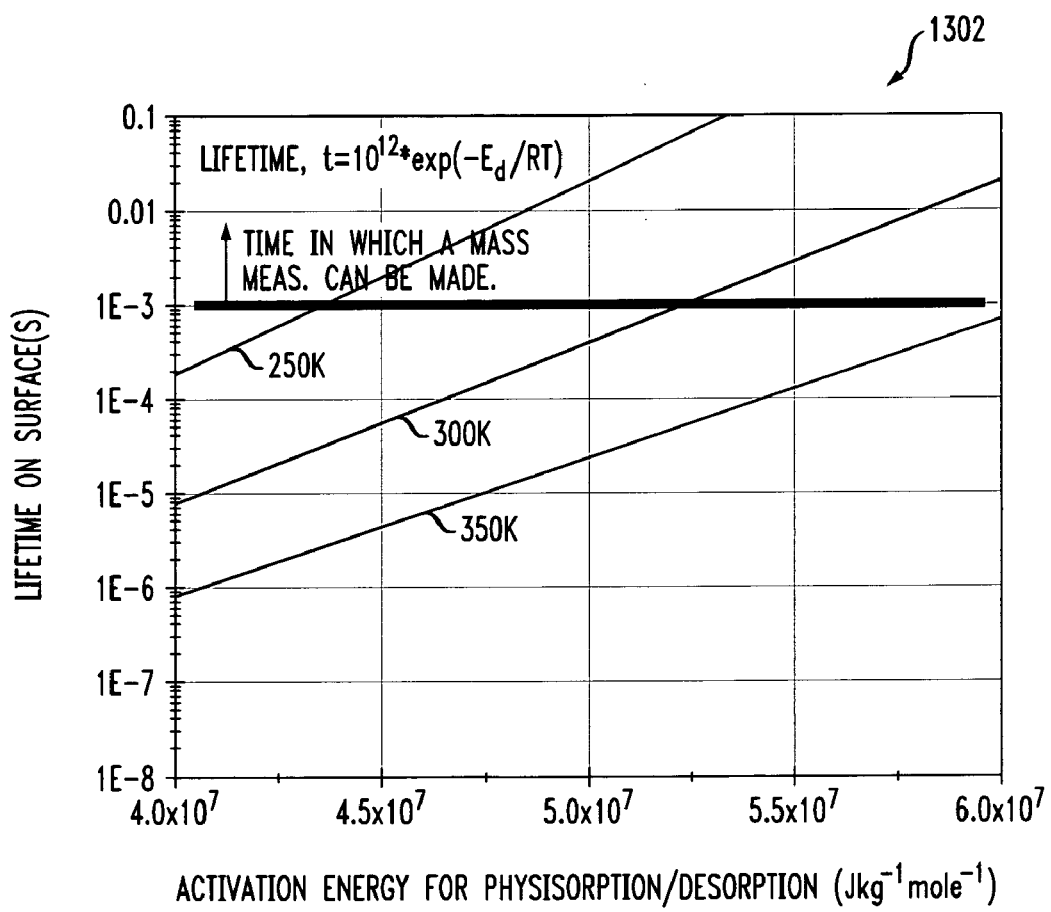
FIG. 13 is an exemplary plot illustrating the effect of surface sensitization according to an embodiment of the present invention.

Mass detection sensitivity can be further enhanced by increasing the amount of time a given molecule remains on the surfaces of mass detection device 100 so as to allow time to obtain an accurate detection reading. As described below, this may be achieved by surface sensitization, e.g., of nanowire 106. FIG. 13 is exemplary plot 1302 illustrating the effect of surface sensitization. Namely, in plot 1302, an estimated lifetime of a molecule on a surface (measured in seconds) is shown as a function of Arrhenius (activation) energy for physio/chemi absorption/desorption (measured in Joules per kilogram·Mole ($Jkg^{-1}mole^{-1}$) for nanowire samples at three different temperatures, i.e., 250 Kelvin (K), 300 K and 350 K. At higher temperatures, the lifetime of a molecule on a surface is decreased.

A goal is to enhance the surface residence lifetime for a selected class of molecules by exploiting silica surface chemistry, i.e., using amines, thiols and carboxyl groups, for functionalization. As such, surface chemistry can be employed to insure that surface residence lifetimes exceed the time in which a mass measurement can be made.

Figure 14:
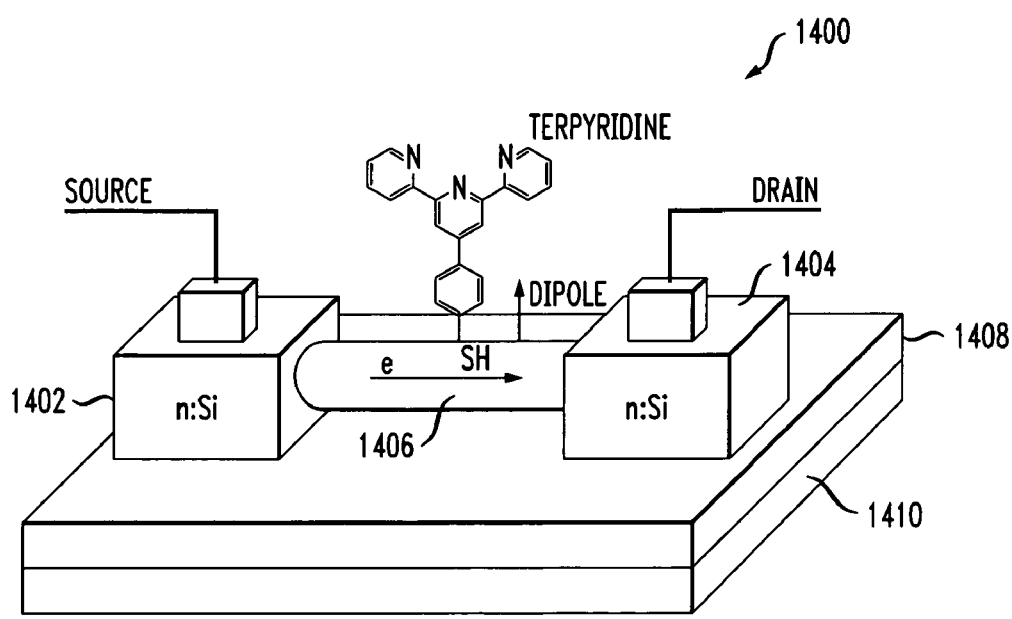
FIG. 14 is a diagram illustrating an exemplary ultra-sensitive molecular detection device according to an embodiment of the present invention.

The enhanced sensitivity mass detection device described herein, can further be configured to act as a molecular detection device. As will be described in detail below, molecular detection utilizes nanoelectrical properties (as opposed to nanomechanical properties) of the device. FIG. 14 is a diagram illustrating exemplary ultra-sensitive molecular detection device 1400. Molecular detection device 1400 comprises source 1402, drain 1404 and nanowire 1406 suspended and clamped therebetween. According to an exemplary embodiment, molecular detection device 1400 employs the same structures and functions as mass detection device 100, described above, and adds the functionality of molecular detection. According to this exemplary embodiment, a combined mass detection device/molecular detection device is provided.

As described above, source 1402 can comprise any suitable metallic or semiconducting material including, but not limited to, one or more of Si, Ge, Pd, Au and Pt. Similarly, drain 1404 can comprise any suitable metallic or semiconducting material including, but not limited to, one or more of Si, Ge, Pd, Au and Pt.

Source 1402 and drain 1404 may have a same, or a different, composition as each other. According to one exemplary embodiment, source 1402 and drain 1404 have the same composition, each comprising Au.

Nanowire 1406 has a length of up to about 100 nm (as measured between source 1402 and drain 1404). Nanowire 1406 can comprise any suitable nanostructure semiconducting material including, but not limited to, one or more of Si, Ge, GaAs, InP, graphene (C) and organic semiconductors, such as Pentacene. According to one exemplary embodiment, nanowire 106 comprises Si.

One or more surfaces of nanowire 1406 are charge-sensitized by the introduction of compounds, including, but not limited to, terpyridine, to the surfaces, i.e., forming charge-sensitized nanowire 1406. As will be described in detail below, molecular detection device 1400 having a charge-sensitized nanowire 1406 can be used to detect the presence of, e.g., a gas species, based on the modulation of a source-drain current due to a charge dipole on the surface of charge-sensitized nanowire 1406 (as shown in FIG. 14).

Below source 1402 and drain 1404 is dielectric substrate 1408. Dielectric substrate 1408 can comprise any suitable dielectric material, including, but not limited to, silicon dioxide (silica) $SiO_2$, hafnium oxide ($HfO_2$) and air/vacuum. Dielectric substrate 1408 may have a thickness of up to about ten nm. According to an exemplary embodiment wherein dielectric substrate 1408 comprises air, dielectric substrate 1408 comprises up to a ten nm gap between source 1402/drain 1404 and gate 1410 (described below).

Gate 1410, e.g., a nanowire transistor gate, can comprise any suitable metallic or semiconducting material, including, but not limited to, one or more of Si, Ge, Pd, Au and Pt. According to one exemplary embodiment, gate 1410 comprises Au.

It is important to note that, as described above, molecular detection device 1400 can function both as an electromechanical mass detection device as described, for example, in conjunction with the description of mass detection device 100 of FIG. 1, above, as well as an electrical molecular detection device, as will be described in detail below. By way of example only, when the charge-sensitized nanowire is separated from the gate by an air/vacuum layer, i.e., the dielectric substrate comprises an air/vacuum layer (see also, the description of FIG. 1, above), the nanowire can actuate. According to this exemplary embodiment, the molecular detection device can also function as a mass detection device. Alternatively, when the charge-sensitized nanowire is separated from the gate by a solid dielectric layer, which may be advantageous in some applications (as a solid dielectric layer can increase the net transconductance effect and thus the signal), the nanowire cannot actuate and the molecular detection device cannot also function as a mass detection device. Either way, for ease and clarity of description of the electrical molecular detection aspects of device 1400, the mass detection functions are not described, but may be obtained by reference to the preceding description.

Molecular detection device 1400 may be employed as part of a circuit. According to an exemplary embodiment, molecular detection device 1400 can be employed as part of circuit 1000, described in conjunction with the description of FIG. 10, above, i.e., in place of mass detection device 100.

Figure 15:
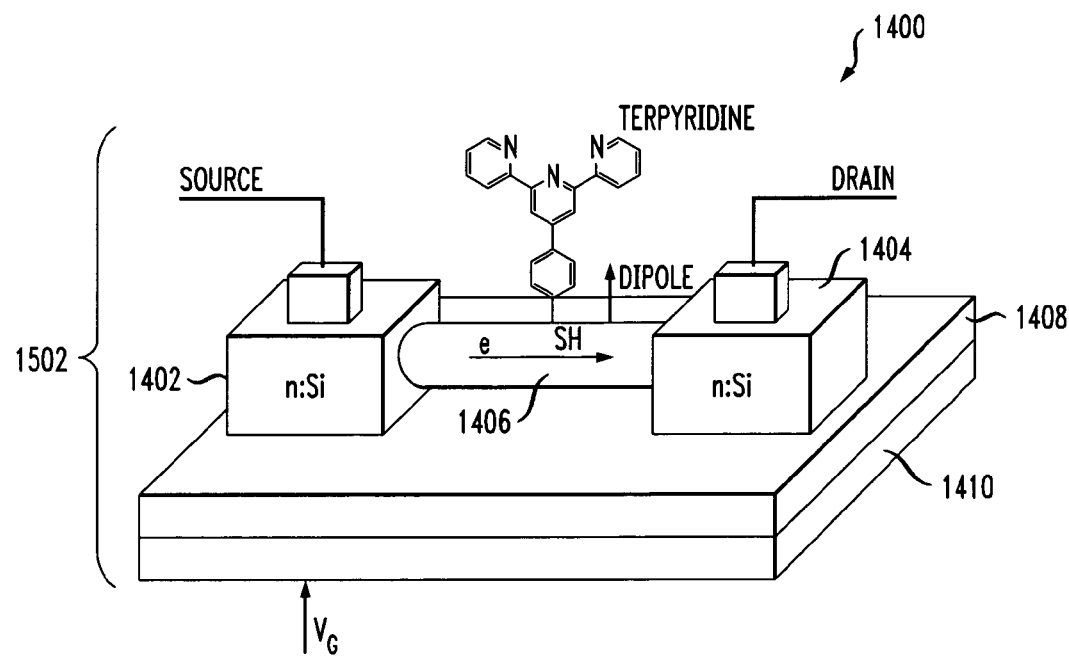
FIG. 15 is a diagram illustrating an exemplary methodology for operation of the molecular detection device of FIG. 14 according to an embodiment of the present invention.
Figure 15:
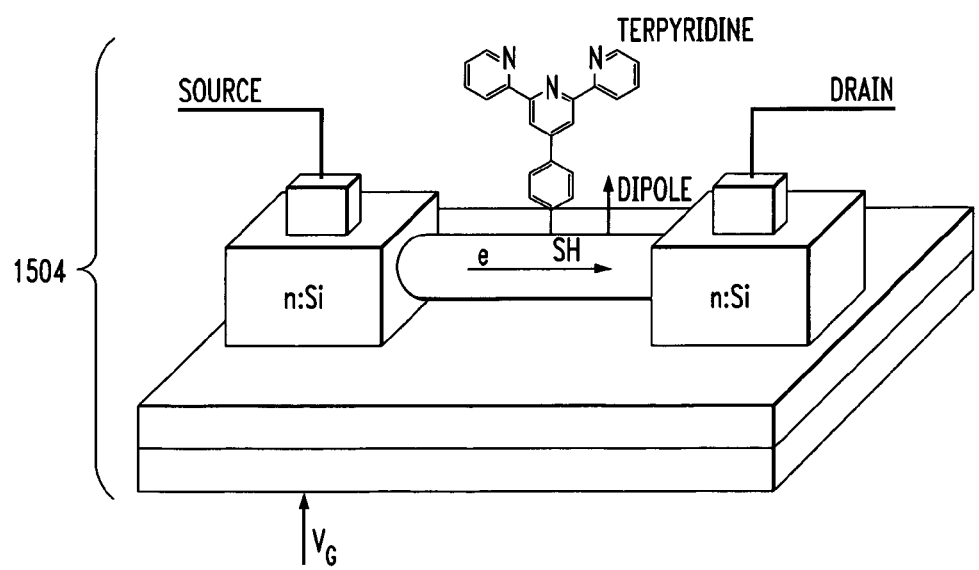

FIG. 15 is a diagram illustrating exemplary methodology 1500 for operating molecular detection device 1400. As described, for example, in conjunction with the description of FIG. 14, above, molecular detection device 1400 comprises source 1402 and drain 1404 separated by charge-sensitized nanowire 1406, and gate 1410 separated from source 1402/drain 1404/charge-sensitized nanowire 1406 by dielectric substrate 1408. As described above, charge-sensitized nanowire 1406 can have one or more compounds, including, but not limited to, terpyridine, on one or more surfaces thereof. Source 1402 and drain 1404 along with gate 1410 (via charge-sensitized nanowire 1406) form a three terminal, nanowire transistor, device.

In step 1502, a gate voltage $V_G$ is applied to gate 1410 resulting in free electrical charge in charge-sensitized nanowire 1406. As such, charge-sensitized nanowire 1406 is turned on (i.e., is conductive) and is similar to a metal having a high conductivity. A source-drain bias voltage $V_{DS}$ may be applied to measure the conductivity of charge-sensitized nanowire 1406. Nanowire 1406 becomes conductive when $V_G$ is greater than a threshold voltage $V_T$ of nanowire 1406.

Alternatively, free electrical charge in charge-sensitized nanowire 1406 of molecular detection device 1400 may be obtained by electronic doping. An electronically doped nanowire 1406 will also have a threshold voltage $V_T$ associated therewith, wherein $V_T$ can be tuned by the doping employed. Suitable dopants include p-type doping agents, such as B and gallium (Ga), and n-type doping agents, such as P, arsenic (As) and antimony (Sb). According to an exemplary embodiment, charge-sensitized nanowire 1406 is configured to have a $V_T$ of less than two V, so that molecular detection device 1400 can be turned on and off with a low power supply.

In step 1504, charge-sensitized nanowire 1406 is exposed to an ambient containing a compound, i.e., a gas, to be detected, for example, nitric oxide (NO). As will be described in detail below, the molecules, e.g., terpyridine molecules, on the surface of charge-sensitized nanowire 1406 react with the molecules in the gas causing charge to be captured from charge-sensitized nanowire 1406. As will be described in detail below, this induces a change in $V_T$ and, concomitantly, a change in source-drain current $I_{DS}$ at a fixed $V_G$. As a result, the current in the nanowire changes. The change in current signifies that the molecules are present.

According to an exemplary embodiment, the change, or shift in $V_T$, i.e., $\Delta V_T$, is proportional to the gas exposure. Namely, a larger gas pressure means that more of the gas will interact with the nanowire charge, and thus a larger $\Delta V_T$ will result. Thus, according to this exemplary embodiment, molecular detection device 1400 can be used to quantify the amount of a gas present.

According to another exemplary embodiment, molecular detection device 1400 can be used to distinguish different gases from one another depending on the molecules which are used to functionalize the surface. By way of example only, molecular detection device 1400 can be configured with various types of chemical functionalization to detect various different gases, i.e., in addition to NO.

Figure 16:
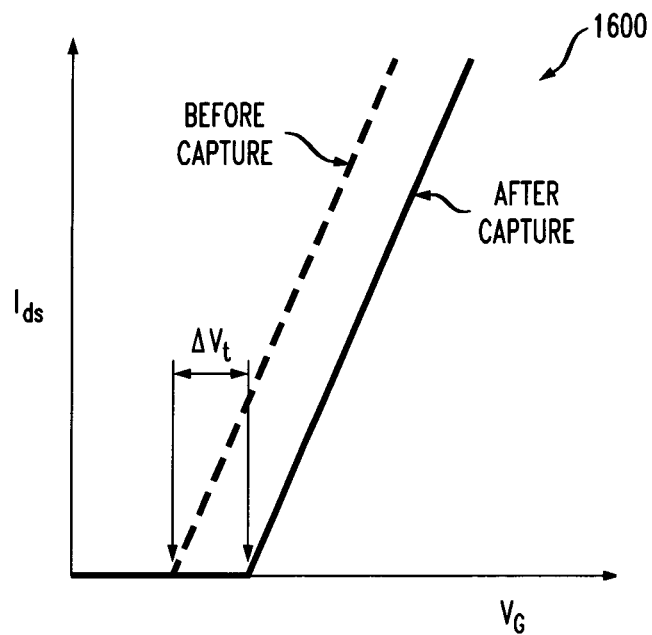
FIG. 16 is an exemplary plot illustrating a shift in threshold voltage as a result of an exemplary molecular detection device reacting with a gas species according to an embodiment of the present invention.

FIG. 16 is exemplary plot 1600 illustrating a shift in threshold voltage $V_T$ as a result of molecular detection device 1400 reacting with a gas species. As shown in plot 1600, a change in $V_T$, i.e., $\Delta V_T$, results in a change in source-drain current $I_{DS}$ at a fixed gate voltage $V_G$.

Figure 17:
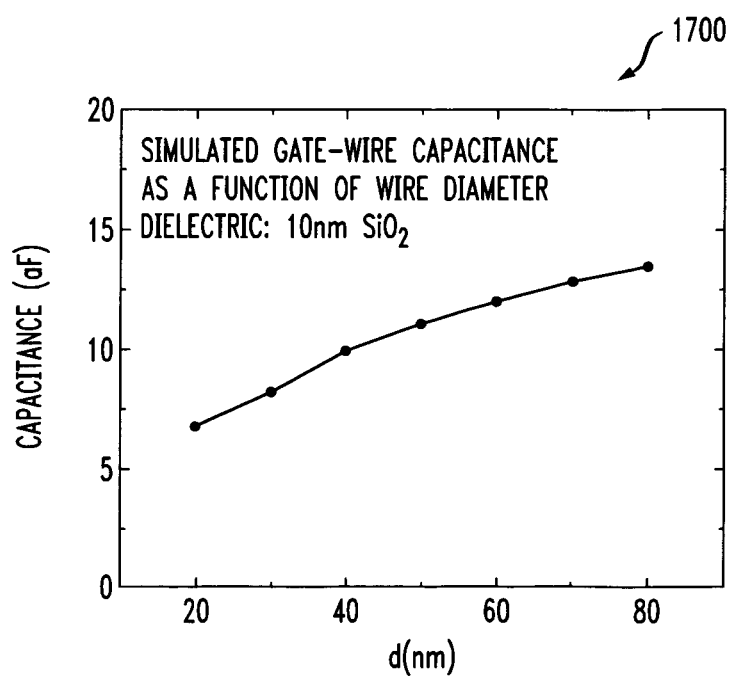
FIG. 17 is an exemplary plot illustrating simulated gate-surface-sensitized nanowire capacitance as a function of surface-sensitized nanowire diameter according to an embodiment of the present invention.

FIG. 17 is exemplary plot 1700 illustrating simulated gate 1410—charge-sensitized nanowire 1406 capacitance (measured in attofarads (aF)) as a function of diameter d (measured in nm) of charge-sensitized nanowire 1406.

Figure 18:
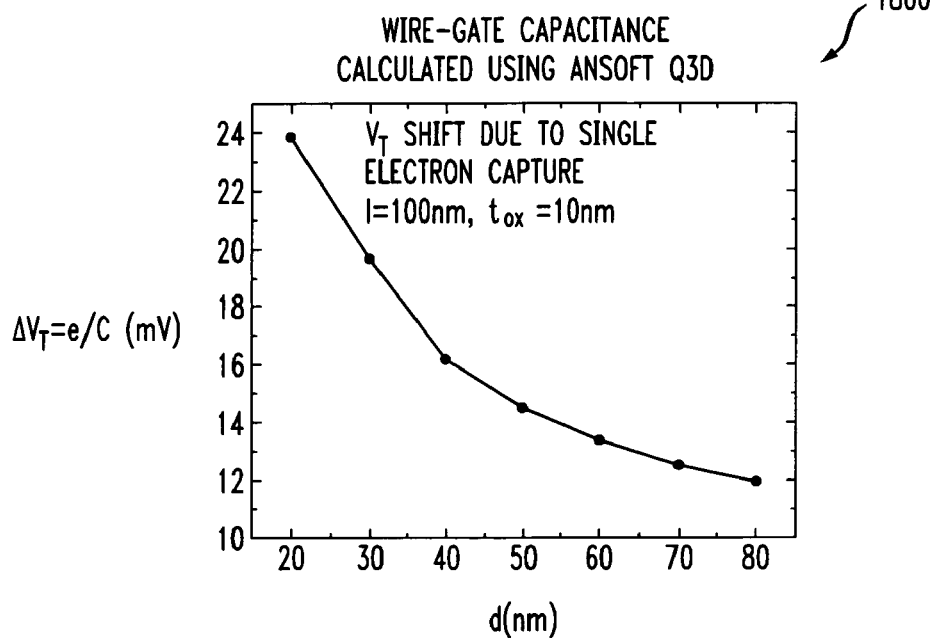
FIG. 18 is an exemplary plot illustrating threshold voltage shift in an exemplary molecular detection device due to a single electron capture according to an embodiment of the present invention.

FIG. 18 is exemplary plot 1800 illustrating threshold voltage $V_T$ shift in molecular detection device 1400 due to a single electron capture. In plot 1800, a change in $V_T$, i.e., $\Delta V_T$, (measured in millivolts (mV)) is shown as a function of the diameter d of charge-sensitized nanowire 1406 (measured in nm). $\Delta V_T$ depends on the captured charge Q and the nanowire gate capacitance C as follows, $$\Delta V_T = \frac{Q}{C} \tag{15}$$

Dielectric 1408 employed in this example comprises ten nm of silicon dioxide ($SiO_2$) and nanowire 1406 has a length of 100 nm. $\Delta V_T$ for a single electron capture may be determined as follows, $$\Delta V_T = \frac{e}{C}. \tag{16}$$

Figure 19:
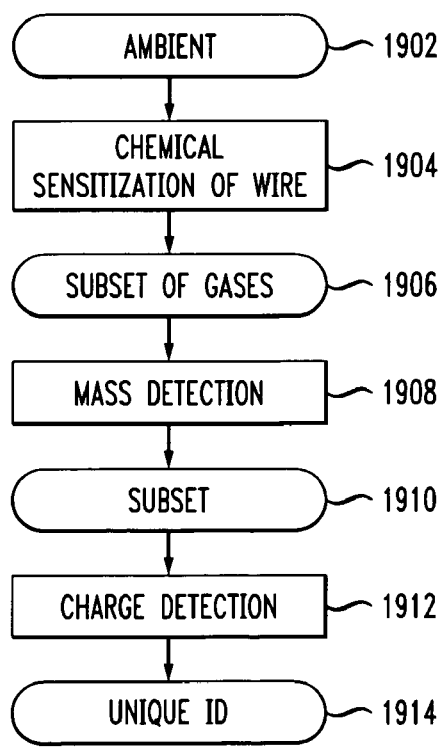
FIG. 19 is a diagram illustrating an exemplary methodology for detection and identification according to an embodiment of the present invention.

FIG. 19 is a diagram illustrating exemplary methodology 1900 for detection and identification. In step 1902, an ambient containing, e.g., a plurality of gasses is provided.

In step 1904, an ultra-sensitive detection device comprising a source, a drain and a nanowire suspended therebetween is provided. The ultra-sensitive detection device can comprise a mass detection device (such as mass detection device 100 described, for example, in conjunction with the description of FIG. 1, above) or alternatively, a combined mass detection/molecular detection device. As described, for example, in conjunction with the description of FIG. 13, above, the surface of the nanowire associated with the detection device can be sensitized to enhance the surface residence lifetime for a selected class of molecules.

Thus, as in step 1906, a subset of the gasses in the ambient will reside on the nanowire surface. In step 1908, the mass of the gasses on the nanowire surface can be determined. See, for example, methodology 200, described in conjunction with the description of FIG. 2, above.

In step 1910, the same, or a different subset of the gasses in the ambient can be exposed to the nanowire surface. In step 1912, the molecules in the gasses can be detected. See, for example, methodology 1500 for molecular detection, described in conjunction with the description of FIG. 15, above. Based on the mass and molecules detected, in step 1914, the gasses are identified.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A detection device comprising:
    a source;
    a drain;
    a nanowire comprising a semiconductor material having a first end clamped to the source and a second end clamped to the drain and suspended freely therebetween; and
    a gate separated from the nanowire by a distance of up to about ten nanometers.

2. The device of claim 1, wherein a length of the nanowire suspended between the source and the drain is between about 100 nanometers and about 200 nanometers.

3. The device of claim 1, wherein the nanowire has a diameter of between about 15 nanometers and about 30 nanometers.

4. The device of claim 1, wherein the gate has a width that is less than a length of the nanowire suspended between the source and the drain.

5. The device of claim 1, further comprising a dielectric substrate between at least a portion of the gate and one or more of the source and the drain, wherein the dielectric substrate has a thickness of up to about ten nanometers and comprises one or more of silicon dioxide, hafnium oxide and air.

6. The device of claim 1, wherein the nanowire comprises one or more of germanium, silicon, galliumarsenide, indiumphosphide, graphene, organic semiconductors and Pentacene.

7. The device of claim 1, wherein at least a portion of a surface of the nanowire has at least one functional group thereon comprising one or more of an amine, a thiol and a carboxyl group.

8. The device of claim 1, wherein at least a portion of a surface of the nanowire is charge-sensitized.

9. The device of claim 1, wherein the nanowire is configured to actuate in response to a voltage being applied to the gate at a given frequency, wherein the given frequency equals a resonance frequency of the nanowire.

10. An integrated circuit comprising:
    at least one detection device comprising:
        a source;
        a drain;
        a nanowire comprising a semiconductor material having a first end clamped to the source and a second end clamped to the drain and suspended freely therebetween;
        a gate in close proximity to the nanowire; and
    at least one frequency modulation demodulator in circuit with the at least one detection device, wherein the at least one frequency modulation demodulator is configured to detect a source-drain current modulation in the at least one detection device.

11. The integrated circuit of claim 10, further comprising:
at least one transimpedance amplifier electrically connected to the drain;
at least one bandpass filter electrically connected to the transimpedance amplifier; and
at least one automatic gain control circuit electrically connected to the bandpass filter.

12. The method of claim 10, wherein the actuating step further comprises the steps of:
applying a voltage to the gate at a given frequency to induce a modulated electric field between the gate and the nanowire at the given frequency wherein the given frequency equals a resonance frequency of the nanowire; and
using the modulated electric field to exert a force on the nanowire at the given frequency.

13. The method of claim 10, wherein the detecting step further comprises the steps of:
using a modulation in distance between the nanowire and the gate, brought about by actuating the nanowire, to induce a modulation of capacitance between the nanowire and the gate; and
using the modulation of capacitance between the nanowire and the gate to induce a source-drain current modulation at a given frequency, wherein the given frequency equals a resonance frequency of the nanowire.

14. A mass detection device comprising:
a source;
a drain;
a nanowire comprising a semiconductor material having a first end clamped to the source and a second end clamped to the drain and suspended freely therebetween; and
a gate separated from the nanowire by a distance of up to about ten nanometers, wherein the gate has a width that is less than a length of the nanowire suspended between the source and the drain, and wherein the nanowire is configured to actuate in response to a voltage being applied to the gate at a given frequency.

15. A molecular detection device comprising:
a source;
a drain;
a nanowire comprising a semiconductor material having a first end clamped to the source and a second end clamped to the drain, wherein at least a portion of a surface of the nanowire is charge-sensitized; and
a gate, at least a portion of which is separated from one or more of the source and the drain by a dielectric substrate, and wherein the gate is separated from the nanowire by a distance of up to about ten nanometers.

16. A method of operating a mass detection device comprising a source; a drain; a nanowire comprising a semiconductor material having a first end clamped to the source and a second end clamped to the drain and suspended freely therebetween; and a gate separated from the nanowire by a distance of up to about ten nanometers, wherein the gate has a width that is less than a length of the nanowire suspended between the source and the drain, the method comprising the steps of:
actuating the nanowire; and
detecting mechanical resonance of the nanowire.

17. A method of operating a molecular detection device comprising a source; a drain; a nanowire comprising a semiconductor material having a first end clamped to the source and a second end clamped to the drain, wherein at least a portion of a surface of the nanowire is charge-sensitized; and a gate, at least a portion of which is separated from one or more of the source and the drain by a dielectric substrate, the method comprising the steps of:
generating free electrical charge in the nanowire, rendering the nanowire conductive;
exposing the molecular detection device to an ambient containing at least one compound; and
detecting reactions between the charge-sensitized surface of the nanowire and the compound.

18. The method of claim 17, wherein the generating step further comprises the step of:
applying a voltage to the gate to generate free electrical charge in the nanowire, wherein the voltage is greater than a threshold voltage of the nanowire.

19. The method of claim 17, wherein the detecting step further comprises the steps of:
inducing a change in a source-drain current, the change in the source-drain current indicating the reactions between the charged-sensitized surface of the nanowire and the compound.

* * * * *